United States Patent [19]
McLaughlin et al.

[11] Patent Number: 4,717,677
[45] Date of Patent: Jan. 5, 1988

[54] FABRICATING A SEMICONDUCTOR DEVICE WITH BURIED OXIDE

[75] Inventors: Kevin L. McLaughlin, Chandler; Mark S. Birrittella, Phoenix, both of Ariz.

[73] Assignee: Motorola Inc., Schaumburg, Ill.

[21] Appl. No.: 766,995

[22] Filed: Aug. 19, 1985

[51] Int. Cl.⁴ .............................................. H01L 21/76
[52] U.S. Cl. ........................................ 437/24; 437/33; 437/61; 437/233; 437/238
[58] Field of Search .............. 29/576 B, 576 W, 576 E

[56] References Cited

U.S. PATENT DOCUMENTS

| | | | |
|---|---|---|---|
| 3,622,382 | 11/1971 | Brack et al. | 148/1.5 |
| 3,897,274 | 7/1975 | Stehlin et al. | 148/1.5 |
| 4,082,571 | 4/1978 | Graul et al. | 148/1.5 |
| 4,101,350 | 7/1978 | Possley et al. | 148/175 |
| 4,241,359 | 12/1980 | Izumi et al. | 357/56 |
| 4,396,933 | 8/1983 | Magilo et al. | 357/50 |
| 4,412,868 | 11/1983 | Brown et al. | 29/576 B |
| 4,490,182 | 12/1984 | Scovell | 148/1.5 |
| 4,601,095 | 7/1986 | Kikuchi et al. | 29/576 B |

OTHER PUBLICATIONS

Ghandhi, S. K. "VLSI Fabrication Principles", 1983, pp. 214, 215, 284, 285.

*Primary Examiner*—Brian E. Hearn
*Assistant Examiner*—Kevin McAndrews
*Attorney, Agent, or Firm*—Joe E. Barbee

[57] ABSTRACT

Base-collector capacitance is reduced in a semiconductor device by making use of a buried oxide that is self-aligned to an active region of the semiconductor device. Use of the buried oxide provides a means for down-scaling or shrinking of the active device region which in turn increases the speed of the device. In addition, the area above the buried oxide is built up to reduce the resistance in the active region.

3 Claims, 14 Drawing Figures

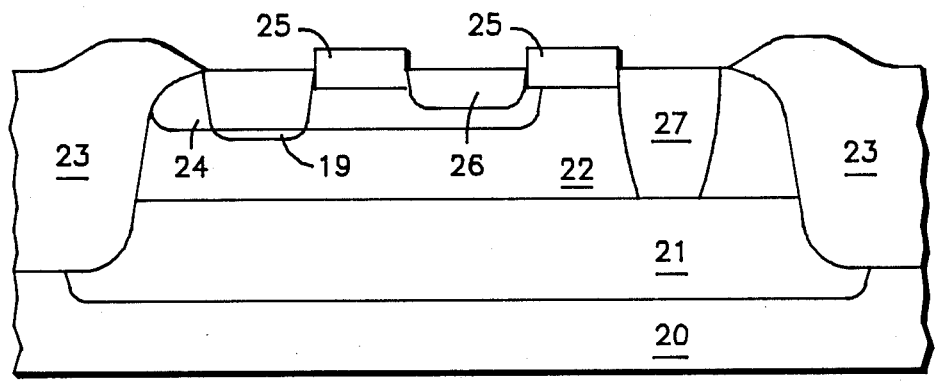
FIG. 1 — PRIOR ART —
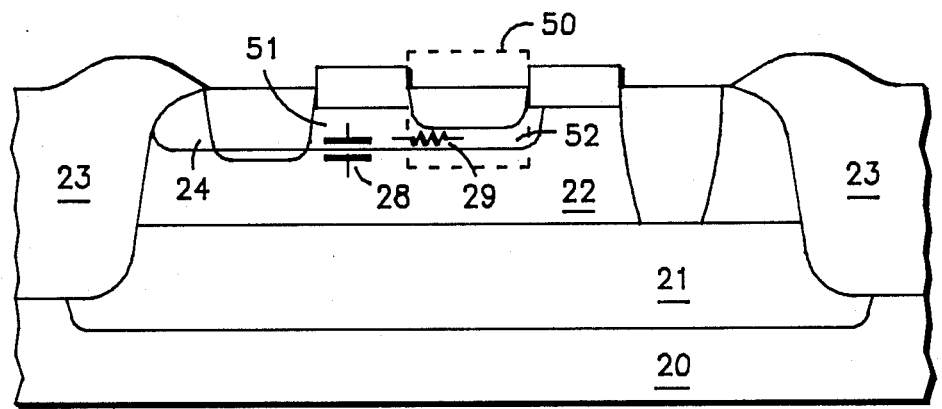
FIG. 2 — PRIOR ART —
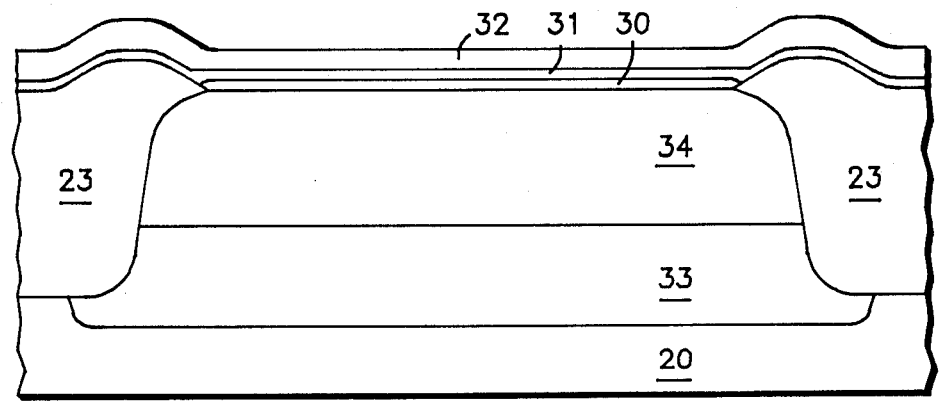
FIG. 3

FABRICATING A SEMICONDUCTOR DEVICE WITH BURIED OXIDE

BACKGROUND OF THE INVENTION

This invention relates, in general, to semiconductor devices, and more particularly to a method of fabricating a semiconductor device which has vertical transistors and a self-aligned buried oxide region.

The advantages of an oxide isolated bipolar integrated circuit structure are well recognized, and include, in particular, increased circuit operating speed and increased packing density. In such a structure, isolation between adjacent devices is provided by an insulating oxide which extends through the epitaxial layer to the underlying substrate. Devices are thus isolated on the edge by the oxide and on the bottom by the PN junction between the epitaxial layer and the substrate. To fully realize the optimum in packing density, device contact areas must be self-aligned since otherwise valuable space must be expended to provide for possible misalignment tolerances.

However, the above structure is limited in the speed of the device due to parasitics such as base-collector capacitance and base resistance. A need therefore existed for a device structure and a method for its fabrication which would reduce such speed-limiting parasitic time constants while maintaining optimum packing density and isolation.

SUMMARY OF THE INVENTION

Accordingly, it is an object of the present invention to provide an improved method for manufacturing a semiconductor device.

Another object of the present invention is to provide a method to increase the operating speed of an integrated circuit.

It is an additional object of the present invention to provide an improved method to manufacture an integrated circuit with low base-collector capacitance. Yet a further object of the present invention is to provide a process for minimizing the size of the inactive device region in a vertical or lateral transistor.

The foregoing and oter objects and advantages are achieved in the present invention which, as part thereof, makes use of a method for fabricating self-aligned, buried oxide integrated circuit devices. The self-aligned, buried oxide is provided between an electrode region of a transistor and the integrated circuit substrate. This reduces parasitic capacitance of the transistor. The depth or thickness of the silicon in the electrode region is then built up to reduce the resistance of the electrode region. Use of the buried oxide provides a means for down-scaling or shrinking of the active device region which in turn increases the speed of the device.

A more complete understanding of the present invention along with further advantages thereof can be attained from the following detailed description in conjunction with the accompanying drawings.

BRIEF DESCRIPTION OF THE DRAWINGS

FIG. 1 illustrates a sectional view of a portion of a semiconductor device found in the prior art;

FIG. 2 illustrates the sectional view of FIG. 1 with the intrinsic, extrinsic and parasitic regions illustrated;

FIGS. 3–10 illustrate, in sectional views, process steps for fabrication of an integrated bipolar transistor in accordance with one embodiment of the invention;

DETAILED DESCRIPTION OF THE DRAWINGS

Figure 4:
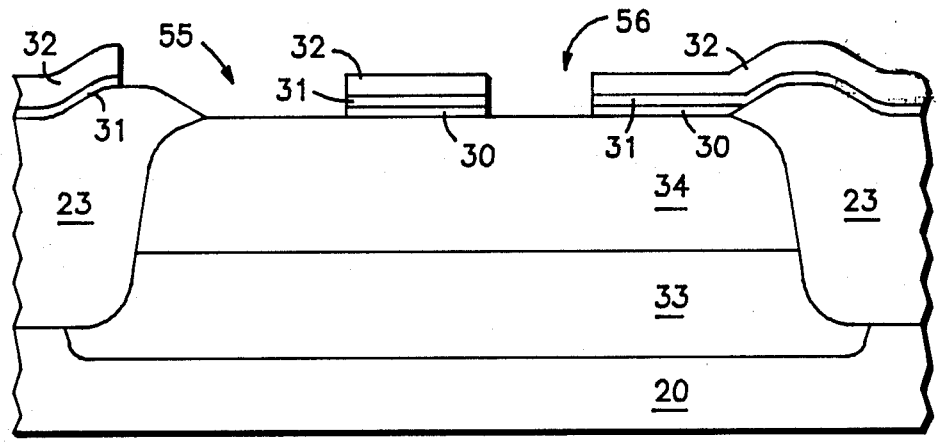

FIG. 1 illustrates a sectional view of a portion of a semiconductor device found in the prior art. The device is an NPN transistor which, together with other devices (not shown), form a portion of a monolithic integrated circuit. The semiconductor device is fabricated with N-type buried layer 21 diffused into P-type silicon substrate 20. The device is isolated from adjacent devices by isolating oxide 23 and on the bottom by a PN junction formed between buried layer 21 and substrate 20. The device includes base 24, base enhancement 19, emitter 26, and deep N+ collector contact 27, which are isolated from each other at the device surface by oxide spacers 25. These device electrodes are located in N-type epitaxial layer 22. Base 24 is doped with boron (P) while base enhancement 19 is heavily doped with boron (P+).

FIG. 2 illustrates the same sectional view found in FIG. 1 except that the intrinsic, extrinsic and parasitic regions are illustrated. Base-collector capacitance 28 and base resistance 29, both parasitics, are formed when a P type region, base 24, is diffused into an N-type region such as epitaxial layer 22. Area 50 is designated the active or the intrinsic device region with area 52 being the intrinsic base. Area 51 is the extrinsic base. The extrinsic base does not contribute directly to the transistor action, but does provide contact to the intrinsic base as well as adding undesired capacitance and resistance to the device.

In the present invention, the structure described in FIGS. 1 and 2 is improved by minimizing the size of both active device 50 and extrinsic base 51, and lowering the values for base-collector capacitance 28 as will be more apparent hereinafter.

Figure 8:
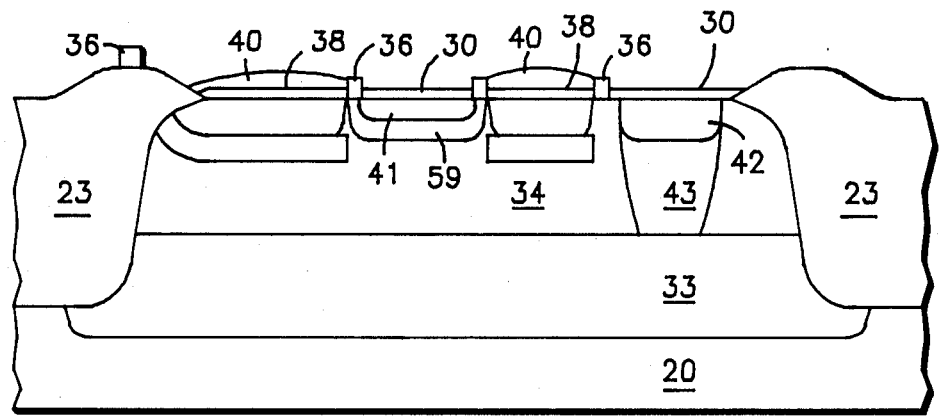
Figure 9:
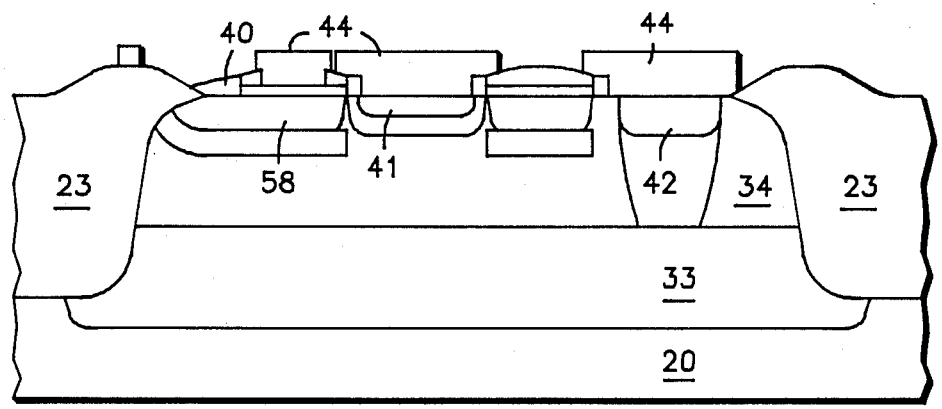
Figure 10:
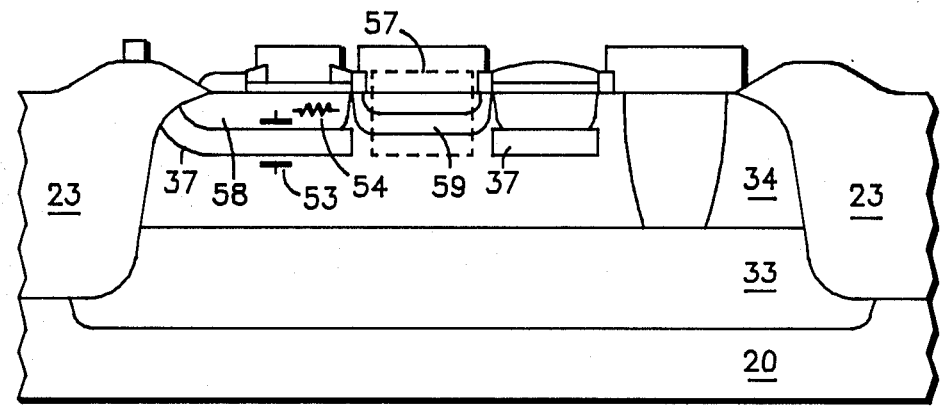

FIGS. 3–10 illustrate process steps followed in accordance with one embodiment of the invention for the fabrication of an improved vertical NPN integrated circuit transistor. As illustrated in FIG. 10, for example, the finished transistor includes a buried oxide that is self aligned to the emitter region to reduce base to collector capacitance, and additional silicon is added above the buried oxide region to insure that the extrinsic base region has a low resistance.

FIG. 3 illustrates a sectional view of a portion of an integrated circuit NPN transistor fabricated in accordance with the present invention. In this embodiment a silicon substrate 20 has been provided with a buried layer region 33. Overlying the substrate 20 and buried layer 33 is an epitaxial layer 34. While an integrated circuit substrate would contain a large plurality of such isolated epitaxial regions, only one such region is shown in FIGS. 3–14 as one such region is sufficient to demonstrate the practice of the invention. In a preferred embodiment of the present invention, epitaxial layer 34 wil be used for the fabrication of a bipolar transistor which will likely be one of many in an integrated circuit structure. In this example, the substrate 20 is P-type, and the buried layer region 33 is heavily doped N-type. The epitaxial region 34 is, for example, 1.5 micrometers in thickness and doped to about 0.4 ohm centimeter N-type. This structure also includes oxide isolation regions 23 which isolate the structure from adjacent devices. The process used to achieve the structure thus described is well known in the semiconductor art, and hence will not be further described.

To continue with the fabrication of the structure described hereinbefore, an oxide layer 30 of approximately 70 nanometers (nm), for example, is formed over epitaxial layer 34 and isolation oxide 23. A nitride layer 31 is deposited over oxide layer 30 and is approximately 100 nm thick. These two layers are used in succeeding etch and implant steps. A plasma oxide 32 of approximately 600 nm thick is deposited over nitride layer 31. Plasma oxide 32 is used as an oxygen implant mask in a subsequent step.

FIG. 4 illustrates a sectional view of the device after the structure has been etched. Using conventional masking and etching techniques known in the art, openings 55 and 56 are formed in plasma oxide 32, nitride layer 31, and oxide layer 30.

Figure 5:
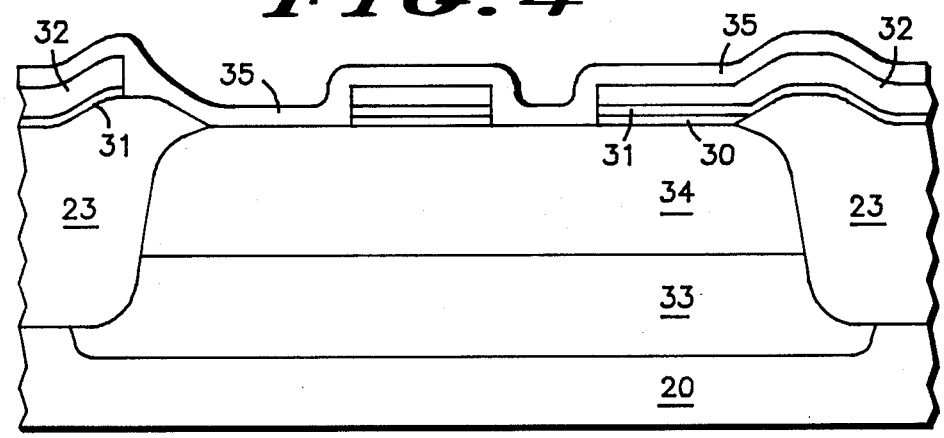

FIG. 5 illustrates a sectional view of the device with the addition of a layer of oxide 35. Oxide layer 35 is deposited over plasma oxide 32 and in openings 55 and 56 that were formed in the previous step. Oxide layer 35 is approximately 200 nm thick.

Figure 6:
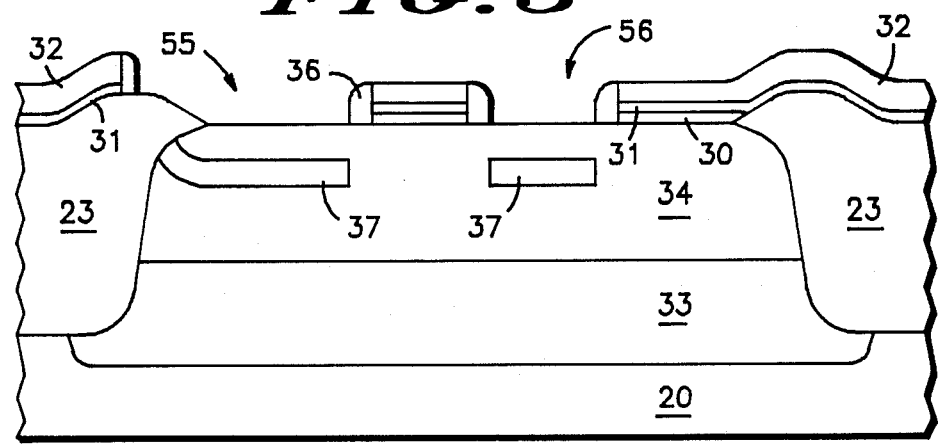

FIG. 6 illustrates a sectional view of the device with the addition of buried oxide 37 and the formation of oxide sidewalls 36. Oxide sidewalls 36 are formed by the unmasked reactive ion etching (R.I.E.) of oxide layer 35. R.I.E. is an anisotropic etch which removes the oxide on the horizontal plane but not on the vertical plane. Oxide sidewalls 36 are used in the preferred embodiment of this invention but it is understood that the use of sidewalls 36 may be optional. Buried oxide 37 is formed by ion implanting oxygen at a dose of 1.2E18 cm$^2$ and at an energy of 400 KeV. Implanting oxygen into openings 55 and 56 and using plasma oxide 32 and sidewall oxide 36 as a mask to prevent selected areas from being implanted, the oxygen is implanted approximately 200 to 400 nm below the surface of epitaxial layer 34. Buried oxide 37 is approximately 200 to 400 nm thick and is self-aligned to sidewalls 36. Although described in this embodiment as a "buried oxide", region 37 is not limited to just oxide but may include any dielectric which may be formed through implantation. An example would be the implanting of nitrogen to form silicon nitride.

Figure 7:
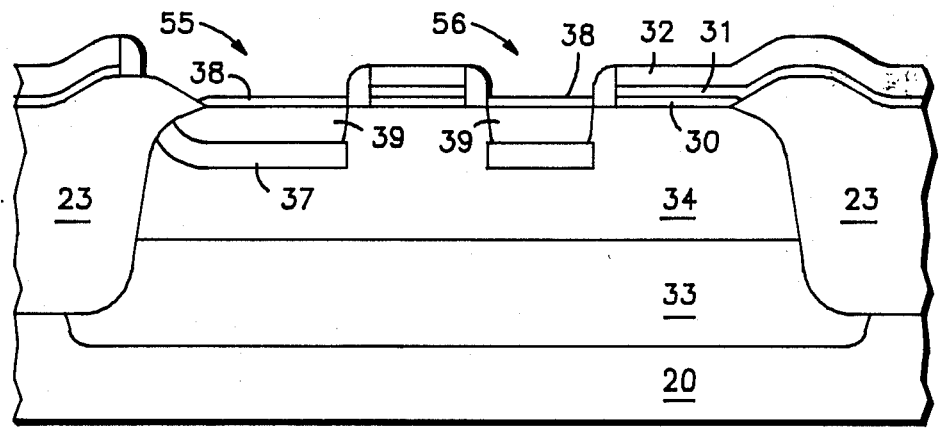

FIG. 7 illustrates a sectional view of the device after epitaxial layer 38 is selectively grown in openings 55 and 56. The epitaxial layer is directly over buried oxide 37 and is approximately 200 nm thick. Epitaxial layer 38 is used to increase the thickness of the extrinsic base region which aids in lowering the base resistance. Boron is then implanted through openings 55 and 56 and is annealed to drive the dopant through epitaxial layer 38 and through that portion of epitaxial layer 34 that is above buried oxide 37. The implant region between epitaxial layer 38 and buried oxide 37 is designated by reference number 39 and now has a sheet resistance of <200 ohms per square and a junction depth of 0.3+0.1 microns. This boron implant (P+) is analogous to base enhancement 19 found in FIGS. 1–2. The combination of implanted doped epitaxial layer 38 and region 39 is referred to as the extrinsic base region which is designated in FIGS. 9–10 by reference number 58.

FIG. 8 illustrates a sectional view of the device after a reactive ion etch and the implantation of dopants into the emitter and collector regions. Plasma oxide 32 and portions, but not all, of oxide sidewall 36 are removed using standard reactive ion etching techniques. An oxide layer 40 approximately 200 nm thick is selectively grown over epitaxial layer 38 to protect layer 38 and to provide dielectric isolation.

The remainder of nitride layer 31 is then removed from the structure by etching while oxide layer 40 protects the surface of epitaxial layer 38. Boron (P−) is implanted through oxide layer 30 into selected regions to from intrinsic base 59. Oxide layer 30 is removed and arsenic (N) is then implanted to form emitter 41 and collector 42. To form deep collector contact 43 phosphorus (N+) is implanted into collector 42. An anneal step is necessary after the implants in order to drive in the dopants and to repair any crystal damage that may have occurred during implantation. The anneal comprises a heat treatment at 1040° C. for 20 minutes. A photoresist mask is used when only selected regions of the device are to be implanted. After anneal, emitter region 41 has a sheet resistance of approximately 25±25% ohms per square and a junction depth of 0.25 ±0.05 microns and deep collector 43 has a sheet resistance of approximately 30 ohms per square and a junction depth of 1.3±0.2 microns. Intrinsic base 59 has a sheet resistance of approximately 500±10% ohms per square and a junction depth of 0.35+0.1 microns.

FIG. 9 illustrates a sectional view of the completed device with the addition of metal contacts 44 over extrinsic base, emitter and collector regions 58, 41, and 42 respectively. Metal contact 44 is formed by depositing a layer of approximately 650 to 850 nm of copper and silicon doped aluminum, for example, over the device and using conventional masking and etching techniques known in the art.

FIG. 10 illustrates the same sectional view found in FIG. 9 except that intrinsic, extrinsic and parasitic regions of the invention are illustrated. Area 57 is considered the active device or the intrinsic region and area 58 is the extrinsic base with area 59 being the intrinsic base. The parasitics of this device are illustrated as base-collector capacitance 53 and base resistance 54.

In comparing FIG. 10 with FIG. 2 of the prior art, it is apparent that extrinsic base 58 of FIG. 10 is smaller than the extrinsic base found in FIG. 2. It is also apparent that the base-collector capacitance and the base resistance found in FIG. 10 would have lower values than what is found in FIG. 2. Base-collector capacitance 53 is reduced due to buried oxide 37, which is self-aligned to the emitter region, and base resistance 54 is reduced due to both the highly doped (low resistance) of the extrinsic base and the additional epitaxial layer 38 which increases the thickness of the extrinsic base.

Figure 11:
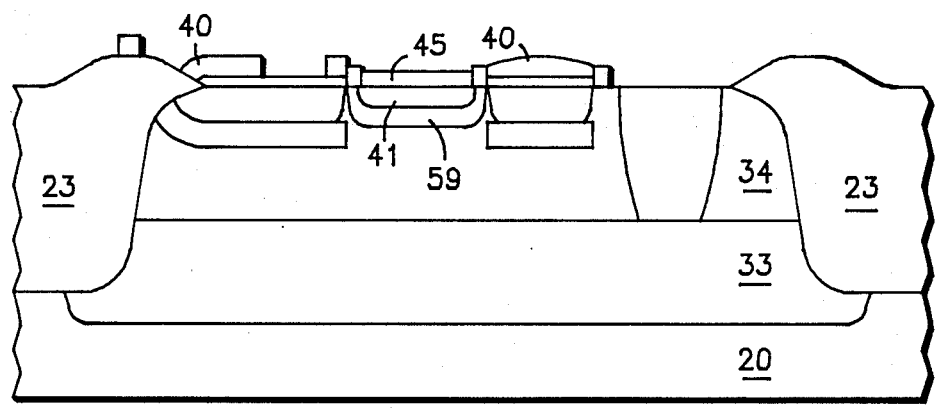
FIG. 11 illustrates a sectional view of an alternate embodiment.

Improvements of implanted transistors with a polysilicon emitter have been well documented. Some of these improvements include lower emitter-base capacitance, higher current gain due to better emitter performance, and improved emitter-base breakdown characteristics. FIG. 11 illustrates a sectional view of an alternate embodiment of an integrated NPN transistor in accordance with the present invention which incorporates the improvements of the polysilicon emitter. In this FIG. 11 embodiment, and referring back to the structure illustrated in FIG. 3, a polysilicon layer of approximately 250 nm is applied over the device prior to oxide layer 30. Basically, all of the implants and etching steps that have been described hereinbefore are the same except that a polysilicon emitter 45 is formed over intrinsic base 59 from the previously deposited polysilicon layer. Region 41 is formed and becomes part of the emitter after polysilicon emitter 45 is implanted with a dopant and annealed.

Figure 12:
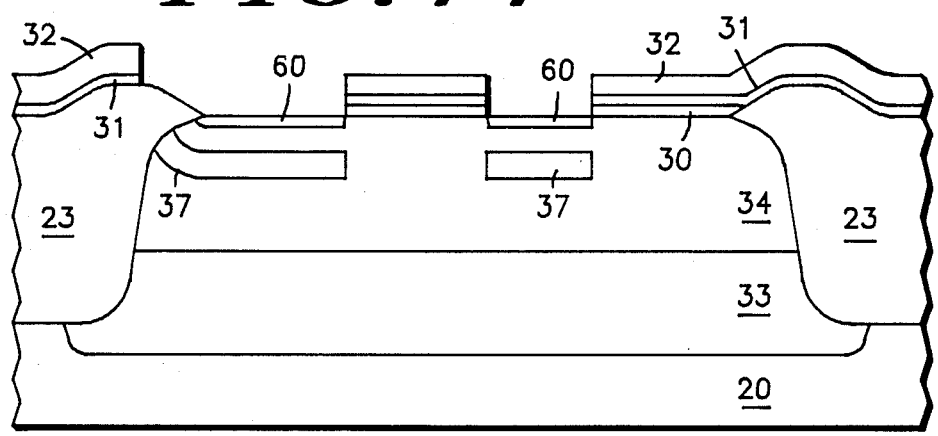
FIGS. 12–14 illustrate a sectional view of still another embodiment.
Figure 13:
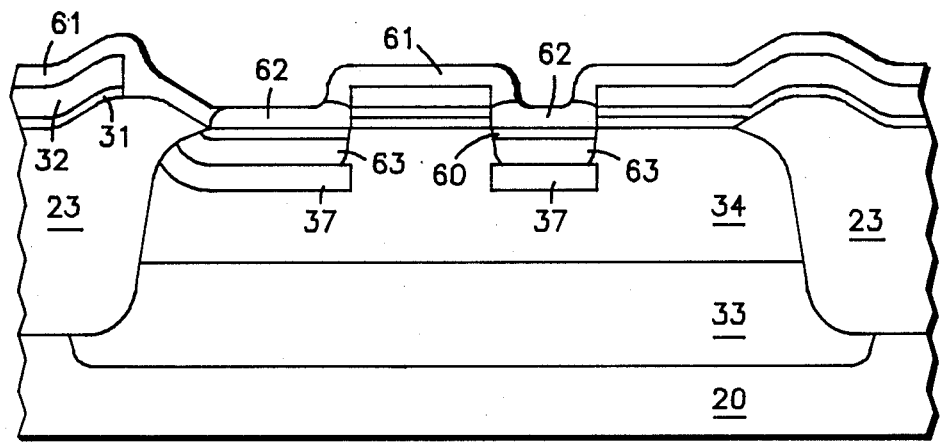
Figure 14:
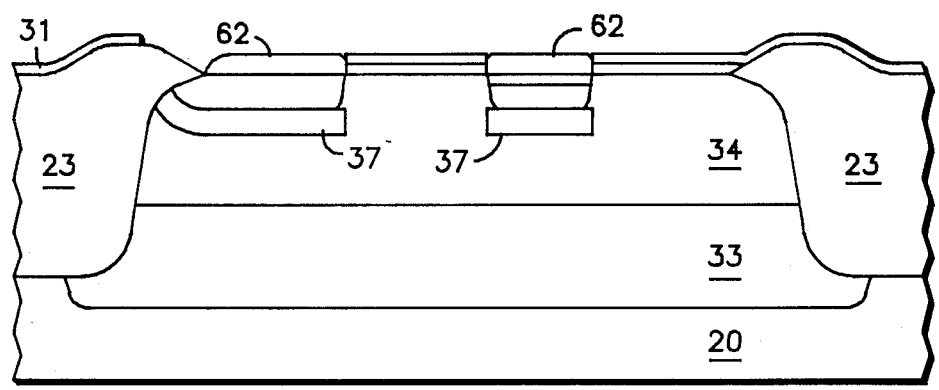

FIGS. 12-14 illustrate sectional views of still another embodiment of the invention to achieve essentially the same structure as shown in FIG. 9. The differences in this embodiment include the use of a polysilicon layer 61 instead of epitaxial layer 38 and the elimination of oxide sidewall 36.

The device illustrated in FIG. 12 is a sectional view of an NPN transistor that is fabricated on a substrate 20 and is isolated from adjacent devices by oxide 23. Included in the device is buried layer 33, epitaxial layer 34, and buried oxide 37. Oxide layer 30 is grown over epitaxial layer 34. Nitride layer 31 is deposited over oxide layer 30 followed by the deposition of a layer of plasma oxide 32. One of the features that is new in this embodiment is the use of a high dose, shallow implantation of boron to form a region 60 in epitaxial layer 34 above buried oxide regions 37. This region 60 serves the same purpose of epitaxial layer 38, which is to lower the resistance in the electrode area of the resulting transistor.

FIG. 13 illustrates a sectional view of the transistor structure with the addition of a layer of polysilicon 61. Polysilicon layer 61 is approximately 300 nm thick with a range of 200 to 400 nm.

After polysilicon layer 61 has been deposited, the device is then annealed at 1000° C. for 30 minutes. The anneal causes boron from region 60 to diffuse into epitaxial layer 34 and to stop at buried oxide 37 and also to diffuse into polysilicon 61. The diffused boron doped region that is located within epitaxial layer 34 is designated by reference number 63. The boron doped region that is out diffused into polysilicon layer 61 is designated by reference number 62.

FIG. 14 illustrates a sectional view of the device structure after the undoped polysilicon layer 61 and plasma oxide 32 has been removed. A solution of hot potassium hydroxide (KOH), for example, is used to selectively etch the undoped regions of polysilicon layer 61 leaving boron doped polysilicon areas 62. Plasma oxide 32 is removed and polysilicon 62 is oxidized to convert the remaining doped polysilicon to a silicon dioxide layer. The remainder of the process is the same as what is described in the description of FIGS. 7-9 except for epitaxial layer 38 which has been replaced by oxidized polysilicon 62 and the elimination of oxide sidewalls 36. In this embodiment, polysilicon 62 is used to provide additional silicon to the extrinsic base region which in turn will lower the extrinsic base resistance. Also, as in the previous embodiment, the buried oxide region is self-aligned to the emitter region, thereby increasing the packing density of the device and simplifying the manufacturing process.

Thus it is apparent that there has been provided an improved semiconductor device and method for its manufacture which fully meet the objects and advantages set forth above. The resulting device is a vertical transistor having a buried oxide region thereby providing an active device region with minimal area and parasitics with minimized values.

Having thus described the invention, it will be apparent to those skilled in the art that various modifications can be made within the spirit and scope of the present invention. For example, changing the ion implantation dopant will change the conductivity type of the device. Instead of a NPN vertical transistor, or a PNP vertical, a PNP lateral transistor could be fabricated. By changing, among other things, the emitter to a gate and dividing the base into a source and drain region, the device structure could become a field-effect transistor.

We claim:

1. A method for fabricating, buried oxide integrated circuit devices which comprises:
   providing a semiconductor substrate having a first epitaxial layer at a surface thereof;
   forming an implant mask over selected regions of the first epitaxial layer, thereby leaving unmasked regions therein;
   implanting oxygen into the unmasked regions of the first epitaxial layer to form a buried oxide region therein;
   selectively applying a second epitaxial layer on the first epitaxial layer over the buried oxide region;
   forming an extrinsic base region by selectively applying conductivity determining impurities into the second epitaxial layer;
   diffusing the impurities through the second epitaxial layer and the first epitaxial layer down to the buried oxide;
   forming an intrinsic base region by selectively applying conductivity determining impurities into the first epitaxial layer adjacent to the extrinsic base region; and
   forming an emitter region by selectively applying conductivity determining impurities into the intrinsic base region.

2. A method for fabricating a, buried oxide integrated circuit device with a polysilicon emitter, comprising:
   forming a buried layer region in a silicon substrate;
   applying a first epitaxial layer overlying the buried layer region and a major surface of the silicon substrate;
   applying a layer of polysilicon overlying a portion of the first epitaxial layer;
   forming an implant mask over selected regions of the polysilicon and first epitaxial layer, thereby leaving unmasked regions therein;
   implanting oxygen into the unmasked regions of the first epitaxial layer to form the buried oxide region therein;
   selectively applying a second epitaxial layer over the buried oxide region;
   forming an extrinsic base region by selectively applying conductivity determining impurities into the second epitaxial layer;
   diffusing the impurities through the second epitaxial layer and the first epitaxial layer down to the buried oxide;
   forming an intrinsic base region by selectively applying conductivity determining impurities through the polysilicon layer and into the first epitaxial layer adjacent to the extrinsic base region;
   forming an emitter region by selectively applying conductivity determining impurities into the polysilicon layer above the intrinsic base region;
   forming a collector region by selectively applying conductivity determining impurities into the first epitaxial layer over the buried layer region.

3. A method for fabricating, buried oxide integrated circuit devices which comprises:

providing a semiconductor substrate having an epitaxial layer at a surface thereof;

forming an implant mask over selected regions of the epitaxial layer, thereby leaving unmasked regions therein;

implanting oxygen into the unmasked regions of the epitaxial layer to form a buried oxide region therein;

forming an extrinsic base region by selectively applying conductivity determining impurities into the epitaxial layer above the buried oxide region;

depositing a layer of polysilicon over the extrinsic base region;

diffusing the impurities through the epitaxial layer down to the buried oxide, and up through portions of the polysilicon layer;

selectively etching an undoped portion of the polysilicon layer; and oxidizing the remaining polysilicon to form a layer of silicon dioxide.

* * * * *